United States Patent
Hariharan et al.

(10) Patent No.: US 9,206,508 B1
(45) Date of Patent: Dec. 8, 2015

(54) LASER ASSISTED CHEMICAL VAPOR DEPOSITION OF SILICON

(76) Inventors: Alleppey V. Hariharan, Austin, TX (US); Jagannathan Ravi, Bedford, MA (US)

( * ) Notice: Subject to any disclaimer, the term of this patent is extended or adjusted under 35 U.S.C. 154(b) by 0 days.

(21) Appl. No.: 13/275,073

(22) Filed: Oct. 17, 2011

Related U.S. Application Data (60) Provisional application No. 61/455,182, filed on Oct. 16, 2010.

(51) Int. Cl.
| | | |
|---|---|---|
| *C23C 16/24* | (2006.01) | |
| *C23C 16/56* | (2006.01) | |
| *C23C 16/48* | (2006.01) | |

(52) U.S. Cl.
CPC ............... *C23C 16/24* (2013.01); *C23C 16/483* (2013.01); *C23C 16/56* (2013.01)

(58) Field of Classification Search
None
See application file for complete search history.

(56) References Cited

U.S. PATENT DOCUMENTS

| | | | |
|---|---|---|---|
| 4,579,750 A | | 4/1986 | Bowen et al. |
| 5,060,595 A * | | 10/1991 | Ziv et al. ................... 118/722 |
| 5,213,997 A * | | 5/1993 | Ishihara et al. ............ 427/554 |
| 5,798,137 A * | | 8/1998 | Lord et al. ................. 427/213 |
| 6,399,429 B1 * | | 6/2002 | Yamoto et al. ............ 438/166 |
| 7,193,273 B2 * | | 3/2007 | Nuttall et al. ............. 257/353 |
| 7,410,889 B2 | | 8/2008 | Chen et al. |
| 2002/0014197 A1 * | | 2/2002 | Keck et al. ................. 117/87 |
| 2003/0196996 A1 * | | 10/2003 | Jennings et al. ......... 219/121.73 |
| 2005/0078462 A1 * | | 4/2005 | Dando et al. ............. 361/783 |
| 2007/0251455 A1 * | | 11/2007 | Wan et al. ................ 118/724 |

FOREIGN PATENT DOCUMENTS

WO    WO2010136529    * 12/2010    ............ C01B 33/027

OTHER PUBLICATIONS

Bruel, "Laser Heating of Thick Layers Through the Backwards, Self-Sustained Propagation of a Steep and Steady State Thermal Front," The European Physical Journal, Applied Physics, 45, 2009, 10304, pp. 1-7.

Haggerty, et al., "Laser-Heated CVD Process for Depositing Thin Films for Low-Cost Solar Cell Applications," Annual Subcontract Progress Report, Feb. 1984-May 1985, Nov. 1985, NTiS, 24 pages.

Hopfe, et al., "Laser CVD vs. Hot Wall CVD: Coating of Fibres for Ceramic Composites," Journal De Physique IV, Colloque C5, Supplement Au Journal de Physique II, vol. 5, Jun. 1995, pp. C5-647-C5-654.

Sears, "Direct Laser Powder Deposition—State of the Art," Office of Scientific & Technical Information, Nov. 1999, available at http://www.osti.gov/bridge/servlets/purl/754936-xpuqpP/webviewable/754936.pdf. 17 pages.

Tonneau, et al., "Pyrolytic Decomposition of Silane on Laser-Irradiated Silica Substrates," Journal de Physique, Colloque C5, Supplement No. 5, May 1989, pp. C5-637-C5-645.

* cited by examiner

*Primary Examiner* — David Turocy
(74) *Attorney, Agent, or Firm* — Wilmer Cutler Pickering Hale and Dorr LLP (57) ABSTRACT

This application describes a bulk and thin film chemical vapor deposition (CVD) process using lasers to heat a silicon substrate to the required deposition temperature. It is primarily applicable to production of polysilicon by the decomposition of halosilanes in a chemical reactor. It is also suitable for other materials that use a CVD process to deposit material on a heated silicon substrate.

14 Claims, 9 Drawing Sheets

CVD REACTOR FOR GROWING SHAPED POLYSILICON FROM
SLIM ROD      (VERTICAL CONFIGURATION)

FIGURE 1. OPTICAL ABSORPTION COEFFICIENT OF SILICON AS A FUNCTION OF THE WAVELENGTH OF THE INCIDENT RADIATION

FIGURE 2. SINGLE SILICON SLIM ROD SIEMENS REACTOR, QUARTZ CHAMBER

FIGURE 3. MULTIPLE SILICON SLIM ROD SIEMENS REACTOR, QUARTZ CHAMBER

FIGURE 4. TEMPERATURE PROFILE IN ELECTRICALLY HEATED SILICON ROD

FIGURE 5. CVD REACTOR FOR GROWING CYLINDRICAL POLYSILICON
FROM SLIM ROD    (SIEMENS PROCESS SUBSTITUTE)

FIGURE 6. CVD REACTOR FOR GROWING POLYSILICON FROM WAFER
(HORIZONAL CONFIGURATION)

FIGURE 7A. CVD REACTOR FOR GROWING SHAPED POLYSILICON FROM
SLIM ROD (VERTICAL CONFIGURATION)

FIGURE 7B. POLYSILICON CHUNKS GROWN FROM INDIVIDUAL SILICON SLAB OR WAFER SUBSTRATES

FIGURE 8. TANDEM REACTOR SCHEME FOR CONVERSION OF TCS AND STC INTO POLYSILICON

LASER ASSISTED CHEMICAL VAPOR DEPOSITION OF SILICON

CROSS REFERENCE TO RELATED APPLICATIONS

This application claims the benefit under 35 U.S.C. §119(e) of U.S. Provisional Application No. 61/455,182, filed Oct. 16, 2010 and entitled "Laser Assisted Chemical Vapor Deposition of Silicon," the entire contents of which are incorporated herein by reference.

All patents, patent applications, patent publications and publications cited herein are explicitly incorporated by reference herein in their entirety. In the event of a conflict between the teachings of the application and the teachings of the incorporated document, the teachings of the application shall control.

FIELD

This application describes a bulk chemical vapor deposition (CVD) process using lasers to heat the substrate to a required deposition temperature. It is primarily applicable to production of polysilicon by the decomposition of halosilanes in a chemical reactor. It is also suitable for other materials that use a CVD process to deposit material on a heated silicon substrate.

BACKGROUND

High purity polysilicon for the electronic and photovoltaic industries is manufactured by the Siemens process. (Handbook of Semiconductor Silicon Technology, W. C. O'Mara, R. B. Herring and L. P. Hunt, Noyes Publications, 1990.) This technology is basically a hot wire (or rod) chemical vapor deposition (CVD) process, in which silicon is deposited on high purity silicon rods at high temperatures by the following processes:

Decomposition of trichlorosilane (TCS), $SiHCl_3$, at ~1050-1150 C $$2SiHCl_3 \rightarrow Si + 2HCl + SiCl_4 \quad (1)$$

Decomposition of silane, $SiH_4$, at ~800-900 C $$SiH_4 \rightarrow Si + 2H_2 \quad (2)$$

The TCS-based Siemens process is the more prevalent in the industry, wherein electrically heated silicon slim rods at ~1150° C. are exposed to trichlorosilane (mixed with hydrogen). (Handbook of Semiconductor Silicon Technology, W. C. O'Mara, R. B. Herring and L. P. Hunt, Noyes Publications, 1990.) The trichlorosilane gas decomposes and deposits silicon onto the heated silicon rods, enlarging them according to the chemical reaction (1).

Pure silicon is intrinsically a nonconductor for electricity at room temperature, with resistivity of the order of 20,000 ohm-cm. Thus, direct initial electrical heating of the slim rod to raise its temperature is not practical. Typically external (or internal) radiant heat from a bank of infrared halogen lamps is utilized to preheat and raise the slim rod temperature to ~400 C. At that temperature, the resistivity of pure silicon decreases to ~0.1 ohm-cm, and the silicon becomes electrically conductive to facilitate direct electrical heating. Even then a high voltage power supply is required to further increase the temperature of the slim rod. When the silicon rods attain a temperature of ~800 C the slim rods will have reached the avalanche breakdown temperature. The high electrical conductivity of the silicon at this temperature requires and permits the high voltage power system to be replaced by a lower voltage-high current power source.

Typically, the external radiant heating is terminated soon after the high to low voltage power switching. The process gas feed (TCS+$H_2$ or $SiH_4$+$H_2$) to the reactor is also initiated at this time. Gases are preheated to ~400 C prior to feeding the reactor. The low voltage-high current electrical power continues to pass directly through the slim rods, and which will enable the slim rods to be heated to the CVD process operating temperature of 1150 C for TCS decomposition or 900 C for silane decomposition. This power supply is also utilized to control the temperature of the deposition process as the slim rod diameters grow in size. Typically high currents, up to 2 kA will flow through a single inverted U-rod. A pyrometer is used to measure and control the temperature of the polysilicon rod during the deposition process. Si grows on the intrinsic Si starting rods, and their diameter increases to ~150-200 mm.

Thus, the Siemens reactor requires many power supplies: (1) a primary independent power supply for preheating the slim rods to 400 C; (2) a high voltage-low current power supply for the second stage heating of the slim rods to 800 C; and (3) a low voltage-high current power supply for the third stage heating of the slim rods to 1150 C and for the deposition process. The second and third stage power supplies have to be incorporated with high voltage switching gear to permit smooth transfer of the electrical power. Since the current drawn by the silicon slim rods at around 800 C is of a run away nature, the switching of the high voltage to low voltage power source needs to be done with extreme care and caution.

The Siemens process is highly energy consuming. A major part of the energy input to the growth rods (greater than 90%) is dispersed and lost as radiant and convective heat. To avoid deposition of the silicon on the inner walls and surfaces of the deposition chamber the reactor walls are generally cooled to less than 50 C. Most of the energy from the hot silicon rods is radiated to the water-cooled bell jars covering the Siemens reactor.

There is a need to simplify the complex method of heating silicon slim rods in the Siemens reactor system.

A further expensive and energy intensive problem related to trichlorosilane decomposition in a Siemens reactor is the generation of large amounts of unwanted by-products. Other reactions that do not produce silicon and that take place in the reactor are:

$$2SiHCl_3 \rightarrow SiH_2Cl_2 + SiCl_4 \quad (3)$$

$$HCl + SiHCl_3 \rightarrow SiCl_4 + H_2 \quad (4)$$

Specifically, several moles of silicon tetrachloride, $SiCl_4$ (STC) are formed for each mole of silicon. The industry typically uses a STC converter, a high temperature hydrogen reactor that consumes considerable energy and only partially converts the STC to TCS, which then needs to be decomposed into polysilicon in another pass through the reactor.

SUMMARY

It is the purpose of this invention to provide a simple and robust process to enable starting the Siemens silicon deposition process without the complex multistage multi-voltage electrical heating process. Method of the disclosure also obviate the need for a STC converter while increasing the yield of polysilicon by a better utilization of the by-product gases.

This application describes a bulk and thin film chemical vapor deposition (CVD) process using lasers to heat a silicon substrate to the required deposition temperature. It is primarily applicable to production of polysilicon by the decomposition of halosilanes in a chemical reactor. It is also suitable for other materials that use a CVD process to deposit material on a heated silicon substrate.

In one aspect, the disclosure relates to a method of making a silicon material. The method includes providing a silicon substrate within a reactor; introducing hydrogen and a silicon precursor gas into the reactor, wherein the silicon precursor gas is selected from the group consisting of dichlorosilane, trichlorosilane, silicon tetrachloride, and mixtures thereof, or silane; heating the surface of the silicon substrate using radiation from a laser; and depositing silicon from the silicon precursor gas onto the surface of the silicon substrate to form a silicon material.

In some embodiments, the silicon material can be a high purity poly crystalline, multicrystalline or monocrystalline silicon material, a bulk material or a thin film. In some embodiments, the heating of the silicon substrate decomposes the silicon precursor into silicon and secondary materials. In some embodiments, the method includes heating the silicon substrate to a temperature at which the silicon precursor decomposes into silicon and secondary materials. In some embodiments, the method includes heating the silicon substrate to a temperature that supports electrical resistance heating of the substrate. In some embodiments, the laser operates between about five hundred watts and one hundred kilowatts, can be selected from a group consisting of, near infrared, visible, and ultraviolet wavelengths, and can be a continuous wave laser.

In some embodiments, the method includes heating the silicon substrate with an electric heat source. In some embodiments, the surface of the silicon substrate can be heated uniformly or non-uniformly. In some embodiments, the non-uniform heating forms a plurality of polysilicon chunks.

In some embodiments, the precursor gas includes trichlorosilane, the surface of the substrate is heated to about or above 1000 degrees Celsius, and the heating decomposes the trichlorosilane into silicon and secondary materials. In some embodiments, the precursor gas includes silicon tetrachloride, the surface of the substrate is heated to about or above 1200 degrees Celsius, and the heating decomposes the silicon tetrachloride into silicon and secondary materials.

In some embodiments, the silicon substrate can be a rod of one of pure silicon or doped silicon, a U shaped rod or a planar silicon substrate. In some embodiments, silicon material can be silicon oxide, silicon nitride, silicon carbide or mixtures thereof In one aspect, the present disclosure relates to a system for making a silicon material. In one embodiment, the system can include a reactor, where the reactor can include a silicon substrate, and a mixture of hydrogen and silicon precursor gas, wherein the silicon precursor gas is selected from the group consisting of dichlorosilane, trichlorosilane, and silicon tetrachloride and mixtures thereof or silane; and a laser located adjacent to the reactor; wherein radiation from the laser heats the surface of the silicon substrate and material from the silicon precursor gas is deposited onto or reacts with the surface of the silicon substrate to form a silicon material. In some embodiments, the reactor includes infrared reflective surfaces to reflect radiative heat back towards the silicon substrate and/or at least one quartz window adjacent to the laser.

DESCRIPTION OF THE FIGURES

Various objects, features, and advantages of the present disclosure can be more fully appreciated with reference to the following detailed description when considered in connection with the following drawings, in which like reference numerals identify like elements. The following drawings are for the purpose of illustration only and are not intended to be limiting of the invention, the scope of which is set forth in the claims that follow.

DETAILED DESCRIPTION

Laser-based systems find use in many metal forming operations such as cutting, drilling, welding, micromachining, etc. High power solid state lasers, e.g., five hundred Watts to a hundred kW, are utilized for several such applications. Many such laser systems concentrate power through fiber optic and other focusing aids. They can be used on a Continuous Wave (CW), quasi-CW or pulsed mode depending on application.

Figure 1:
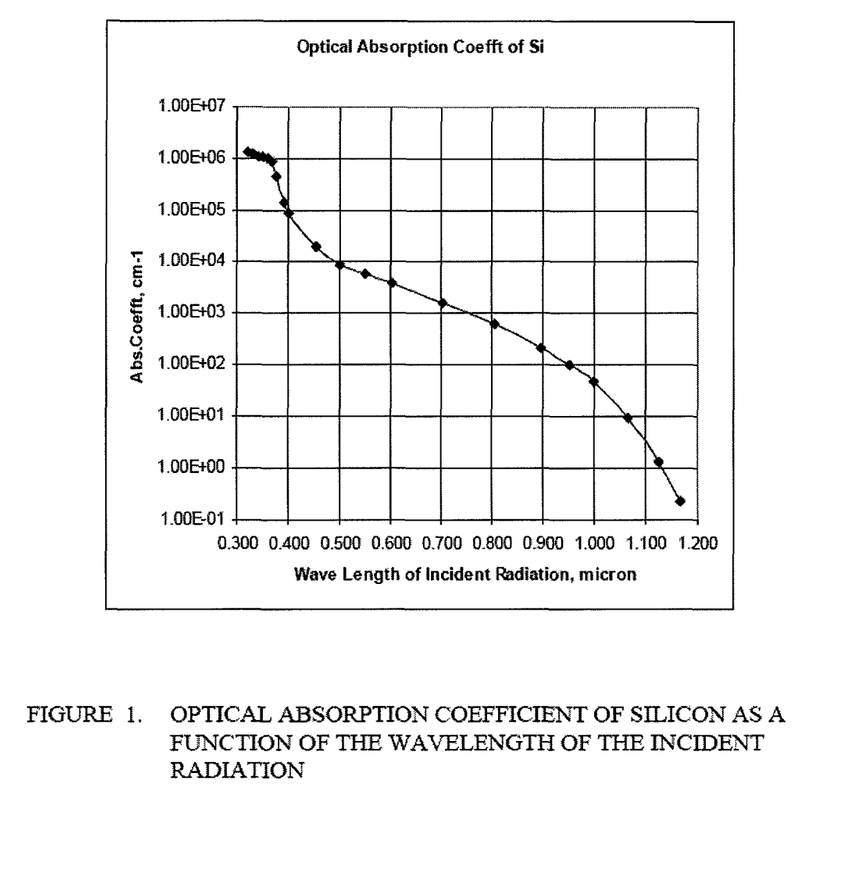
FIG. 1 is a graph of the optical absorption coefficient of silicon as a function of the wavelength of incident radiation.

Elemental silicon is uniquely positioned to utilize laser heat processes. Its optical absorption increases exponentially when the incident radiation has wavelengths shorter than one micrometer. This is shown in FIG. 1, where the optical absorption coefficient of silicon is plotted against the incident wavelength of the radiation. Efficient absorption of such short wavelength radiation will cause the silicon to heat rapidly.

Lasers with emission wavelengths extending up to the near infrared are suitable for heating silicon. Examples of such are neodymium and yttrium YAG lasers and modern fiber lasers incorporating these are capable of very high powers (in the kW range). These are precision lasers. But for heating applications, a very efficient type of laser is required.

Recently, semiconductor diode lasers have become more feasible for material processing, e.g., larger power such lasers are becoming available. With respect to silicon, at the near infrared lasing wavelengths (850-1000 nm), very high power conversion efficiencies (electrical to optical) of greater than 65% can be achieved since these devices are directly energized and electrically activated, rather than being optically pumped. Many of the diode lasers e.g., GaAs, AlGaAs, InGaAs, InGaAsP, etc., lasing in the 750-1900 nm range, would be highly efficient energy sources for silicon heating. They are typically used to optically pump Nd or Yb glass, YAG or fiber lasers, but may be used directly as well. When semiconductor lasers in the UV and visible spectrum, for example, GaN 415 nm, InGaAlP, 630-680 nm, GaInP 670 nm, become available at higher powers, these lasers will be excellent sources for heating silicon because of the much higher absorption coefficients at these wavelengths.

In one aspect of present disclosure, a direct heat process is provided by use of radiation in an energy band that is efficiently absorbed by the silicon. The process thus uses selective laser wavelengths and energies as described above to heat silicon.

For silicon deposition, lasers as a heat source can be employed in two ways:

(1) Laser assisted electrical heating and,
(2) Laser heating only.

In the former, the silicon starting substrate is initially heated by direct laser heating to temperatures of ~800 C wherein the silicon substrate becomes electrically conducting. Once the substrate reaches that temperature a low voltage-high current power supply is used to resistively and directly raise the silicon substrate to the deposition temperature of ~900 C or ~1150 C depending upon the process gas. The initial laser heating enables a simpler and more efficient initial heat system for the Siemens process. Hence, this method can be described as Laser Assisted Siemens Process. Further details are given below.

For bulk polysilicon deposition by Method 2, the silicon substrate can be laser heated to the deposition temperature and then held continuously at the deposition temperature for an extended time period. This method requires a unique use of laser sources to operate continuously for periods of days at a time.

Using laser heating instead of the prior electrical heating methods has several advantages. First, the disclosed laser heating does not introduce any contaminants, such as electrical feed-throughs. Second, the laser heating method is faster, as the silicon substrate can be brought to a high temperature more quickly than with electrical heating. Third, because the laser heating method does not rely on electrical heating, any form factor can be used as the initial silicon substrate. Fourth, thicker polysilicon materials can be created with laser heating. These thicker materials arise for a plurality of reasons, including: the laser heating method heats the surface of the silicon substrate, instead of the interior of the substrate, as is done in the prior art electrical heating methods; form factors for the underlying silicon substrate can have larger surface areas (or as many unconnected substrates), than with electric heating; the process is more energy efficient because only the surface of the silicon is heated. Fifth, the disclosed method and system provide the ability to grow separate polysilicon chunks. Finally, because the laser heating method permits heating of the silicon substrate to temperatures of 1200 degrees Celsius and above, the disclosed laser heating method can deposit silicon using silicon tetrachloride precursors.

EXAMPLES

Method 1

Laser Assisted Siemens Process

Figure 2:
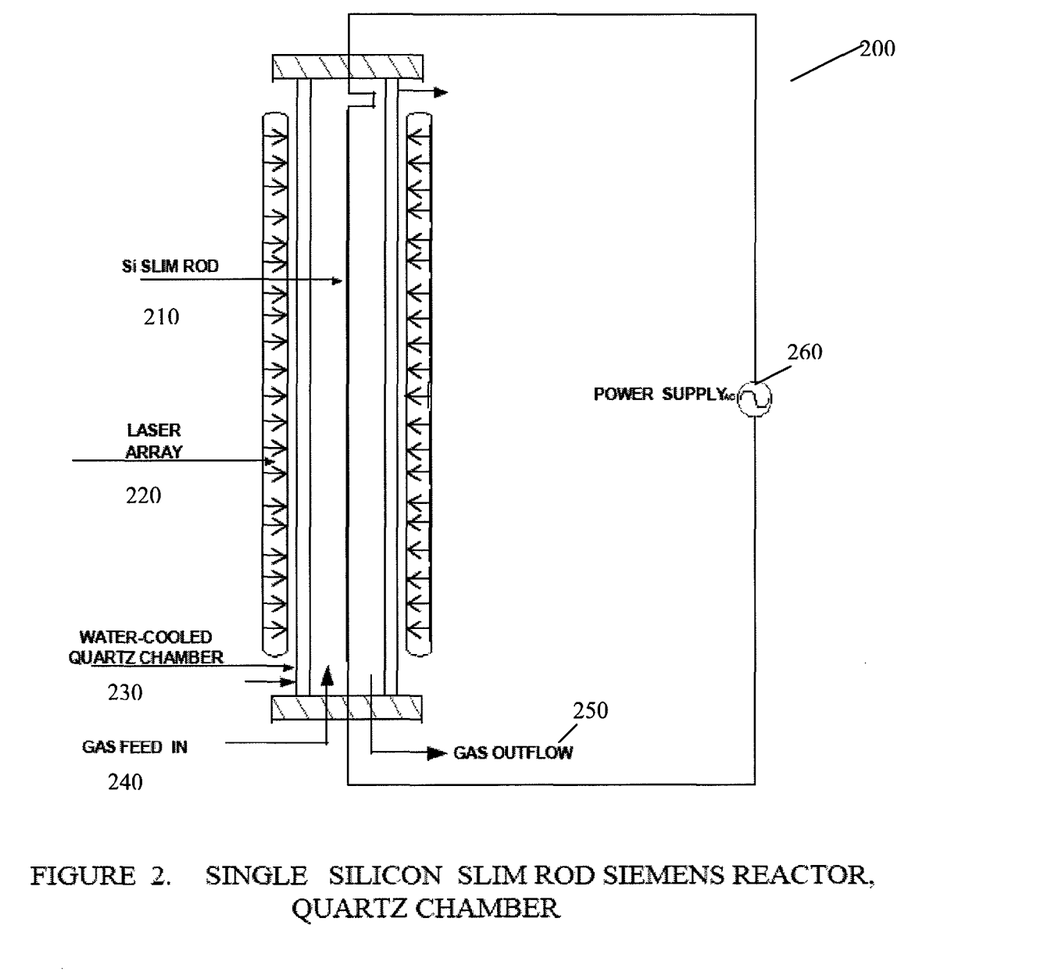
FIG. 2 illustrates a single silicon slim rod Siemens reactor having a quartz chamber, according to embodiments of the present disclosure.

A schematic of a single slim rod Siemens CVD reactor with quartz outer tube is shown in FIG. 2. The concept shown in FIG. 2 can be extended to a multiple slim rod reactor and for lasers mounted inside a metal bell jar assembly.

Slim rods are hyper pure silicon rods of diameter 7-10 mm, and length 1 to 2.5 meters depending on the polysilicon deposition reactor design. Small reactors may have a single slim rod oriented vertically in a quartz bell jar system. Larger reactors may be made of quartz or metal bell jars, and the slim rods are oriented vertically as inverted U-rods. As many as 18 such U-rod assemblies are typical in today's commercial polysilicon deposition reactors. Electrical power to the slim rods, for electrical heating of the slim rods, is provided through graphite contact rods.

The silicon production rate in terms of kg per hour is very low at the initial stage since the silicon slim rod diameter is small. As the rod grows in diameter (and thus the surface area) the $TCS+H_2$ or $SiH_4+H_2$ gas flow rate and electrical power have to be continuously adjusted during the deposition process to obtain optimal deposition rate. Deposition rate from TCS is ~6-7 microns/min, while from silane the rate is 3-6 microns/min. The growth rate depends strongly on the operating pressure, and TCS based system can achieve deposition rates of greater than 20 microns/min at 6 atmospheres. Each inverted U-rod with 2.5 meter long slim rods accumulates ~175 kg polysilicon during the extended process run, to a total of ~3200 kg per 18 U-rod reactor assemblies. Such reactors are operated at elevated pressures to increase polysilicon deposition efficiency. In prior art Siemens processes, it typically takes about 5 days of operation to attain the final silicon rod sizes.

Doped silicon slim rods are used in some special applications. Doping lowers the cold resistivity of the rod. External heating is not required to reach the initial 400 C, and is reached by direct application of high voltage to the slim rods. High purity silicon is not grown using doped starting rods.

Example 1

The steps of some embodiments for making high purity polysilicon in a reactor system 200 of FIG. 2 are described below. The reactor system 200 is assembled and tested for integrity and hermeticity. The reactor system 200 includes a silicon slim rod 210, a laser array 220, a quartz chamber 230, a gas feed in 240 and a gas outflow 250 into and from the quartz chamber 230 and a power supply 260. The quartz chamber can be water cooled. The laser array 220 generally, is located outside of the quartz chamber 230. The reactor system 200 can be designed with efficient infrared reflectors mounted behind the laser arrays 220 to reflect the radiative heat back to the silicon deposition rod and thereby improve the process energy efficiency. The slim rod 210 also can be referred to as a silicon substrate.

Electrical connections to the single vertical slim rod can be made from a low voltage-high amperage power system. The system is evacuated and purged several times to clean the environment of the slim rod. Cooling water flow to the reactor wall is initiated. Inert argon flow is utilized in the initial process stage. The externally mounted banks of laser heat sources are activated to impinge its flared beam on to the surface of the slim rod. The laser beams can be used either as a Continuous Wave (CW) form, modulated CW or pulsed form, depending on the desired heating profile. As the temperature of the slim rod increases, the argon flow is replaced with hydrogen gas. When the slim rod temperatures approach ~800 C solely from the laser heat source, the low voltage-high amperage power system is activated to take over heating the slim rod. The laser heating may be terminated at this stage. When the slim rod attains ~1150 C a defined mix of $TCS+H_2$ gases is introduced into the reactor to begin the silicon deposition process. Thereafter, the composition of the mix gas and temperature control of the slim rod are adjusted to provide for the silicon rod growth. The growth process can be terminated after silicon rod attains the desired diameter.

The heating power required for a single reference slim rod, 10 mm diameter x 1000 mm long, at the temperature when the system can be transferred to direct electrical heating is estimated as ~1300 watts per slim rod. This power can be supplied by a bank of lasers of nominal optical power capacity or from an array of lasers split from a single laser of adequate power.

Major heat loss in the system is from radiative losses (~90%). In Siemens reactors with quartz bell jar envelope the radiative heat is lost to the shell cooling water. However, in metal bell jar systems a part of the radiative heat is reflected back to the growth rods, while the rest is lost to the cold reactor shell. The laser-assisted Siemens process system can be designed with efficient IR reflectors behind the laser arrays to recover part of the radiative heat loss during the deposition process, and thereby improving the process energy efficiency.

Example 2

Figure 3:
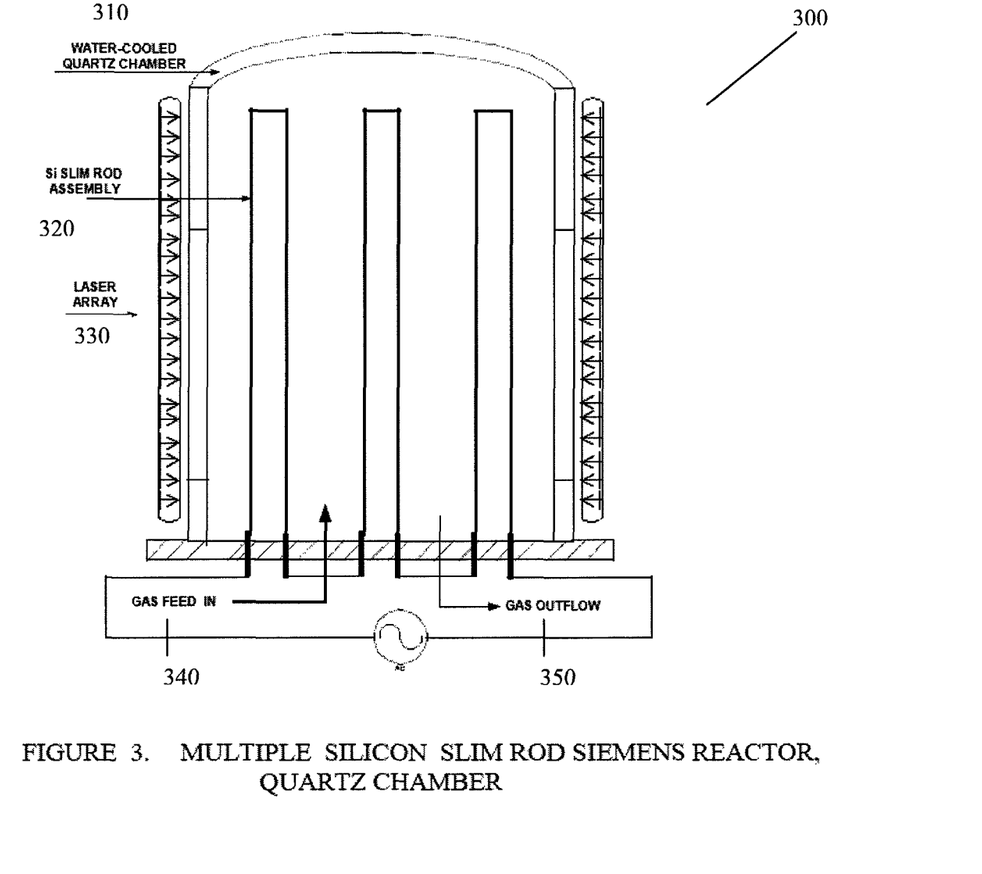
FIG. 3 illustrates a multiple silicon slim rod Siemens reactor having a quartz chamber, according to embodiments of the present disclosure.

The steps, according to one embodiment, for making high purity polysilicon in the quartz bell jar reactor system 300 of FIG. 3 with multiple slim rods in the form of inverted U are basically the same as described previously for a single slim rod. The reactor 300 includes a water cooled quartz chamber 310, a plurality of U-shaped slim rods, fashioned as a silicon slim rod assembly 320, a laser array 330, a gas feed in 340 and a gas outflow 350. In practice the low voltage high current power supply is connected in series to the several sets of inverted U-rods. The location and number of laser heat sources are a matter of efficiency and design feasibility in conjunction with the location of the inverted U-rods.

When a metal bell jar reactor system with multiple slim rods in the form of inverted U is used instead of the quartz bell jar system of Example 2, the banks of laser heat sources are internally mounted within their protective quartz envelopes inside the reactor. The location and number of laser heat sources are a matter of efficiency and design feasibility in conjunction with the location of the inverted U-rods. The other functional details of the metal bell jar reactor system is similar to the quartz bell jar reactor system 300 of FIG. 3.

Reactors with a quartz outer chamber and single slim rod are used for specialized polysilicon deposition by the Siemens process; such reactors are typically custom designed for specific use. Industrial polysilicon depositions utilize metal bell jar reactor systems with typically 18 slim rods and capable of operating at high process pressures and are manufactured by GT Advanced Technologies, Inc. (Merrimack, N.H.) and Centrotherm SiQTEC GMBH (Germany).

Variations of Method 1

Although this invention describes use of selective laser heat sources for the preheat stages of conventional Siemens process to manufacture high purity polysilicon, the invention is equally applicable where doped silicon slim rods are utilized instead of intrinsic silicon slim rods.

Method 2

Laser as Sole Heat Source for Silicon Deposition

In Method 2, the laser is the only heat source. There is no electrical heating and the objective is to heat the surface of the substrate only. This is possible because of the very high absorption coefficient of silicon up to the near IR wavelengths. The absorption depth, which is the reciprocal of the absorption coefficient, is the distance at which the radiation drops to the 1/e fraction of the surface amplitude. Hence, for a laser with wavelength around 1 µm, the radiation is nearly fully absorbed at a depth of less than 1 mm. (Absorption depth of Semiconductor materials, http://pvcdrom.pveducation.org/SEMICON/ABSDEPTH.HTM) Essentially, the heating due to the laser is only at the surface. Bulk heating, as occurs in the Siemens process, is inefficient since the deposition can only occur on the outside surface, but the whole volume is at a high temperature. The process conditions for deposition such as temperature, pressure and gas composition are similar to those disclosed above. However, the time to achieve a certain output of polysilicon according to this embodiment can be considerably reduced.

Figure 4:
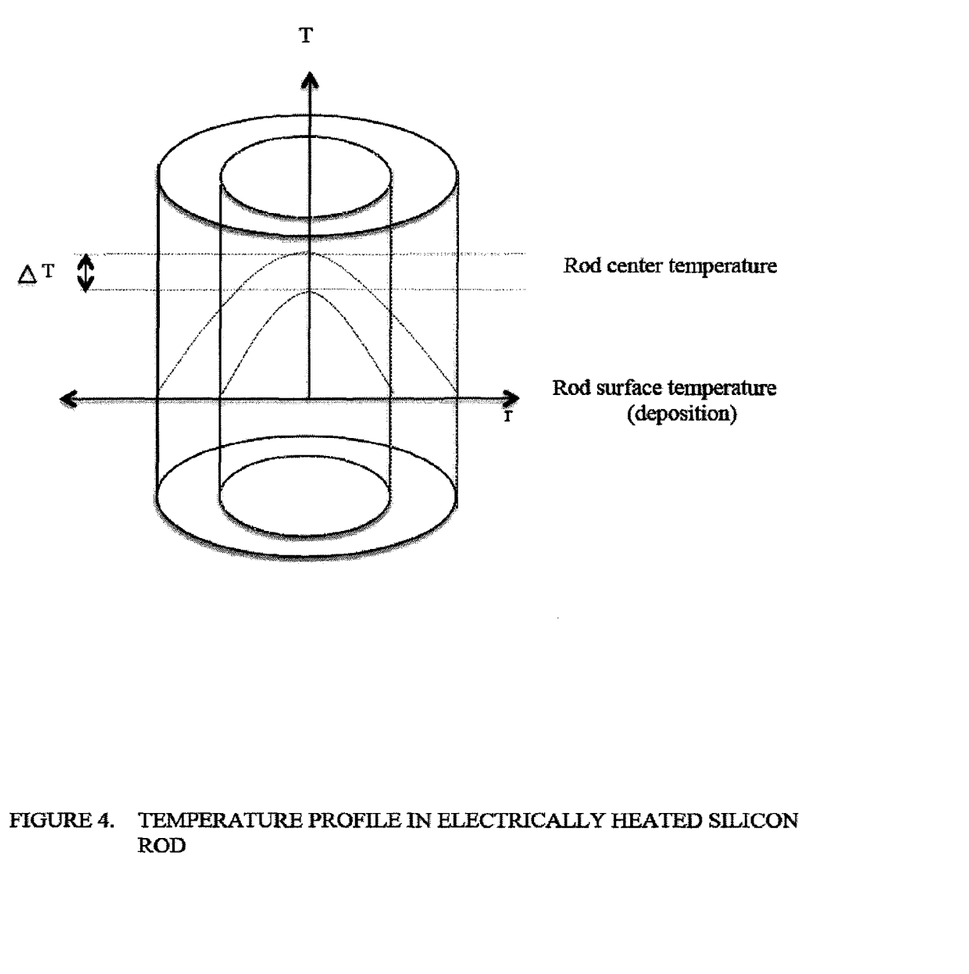
FIG. 4 illustrates a temperature profile of an electrically heated silicon rod.

Electrical heating of the bulk also causes significant temperature problems in the core of the cylindrical substrate. (Device and Method for producing a uniform temperature distribution in silicon rods during precipitation process, P. Wallmeier, US Patent Appl. 2009/0229991). The electrical conductivity of silicon increases with temperature while the thermal conductivity decreases with temperature. This causes higher current in the center of the rod resulting in a large temperature gradient from the inside bulk to the outside surface. The temperature gradient across the radius of the rod can be so extreme to cause even silicon melting while the surface temperature is at ~1150 C. FIG. 4 shows the increase in the core temperature of the rod even as the surface temperature is required to be constant. (http://www.ipvea.org/fileadmin/association/img-content/pv-production-forum/2010/PV_Production_Forum_-_AEG_PS_-_Gladwyn_De_Vidts.pdf) This process causes significant thermal conduction loss, thus effectively increasing the silicon deposition energy demand. The higher core temperature in the rod with diameter increase is a limiting factor for the maximum diameter of the silicon rod that is practical. The radial temperature gradient due to electrical heating in Siemens reactor designs poses additional restrictions on gas flow parameters, deposition temperature and surface geometry.

It is understood that when using the laser as a heat source, the beam power, intensity, wavelength, spatial and temporal modulation, etc. are important parameters that can be appropriately adjusted for best results. For example, in an embodiment using a laser with an emission wavelength of ~1000 nm to heat a thin silicon starting substrate, laser power intensity of 100-250 W/cm$^2$ applied for about 10 seconds, this set up will bring the surface temperature to a temperature between 800 to 1200 C. Subsequently, the laser power can be reduced if the temperature has to be maintained at a constant level. The beam power is distributed uniformly over the silicon surface. Yet there may be temperature variations due to minute thickness differences, edge effects, gas convective effects, etc. Temperature uniformity can be ensured by spatial modulation of the beam, by scanning, or by temporal modulation of the individual lasers forming the array.

Example 3

Figure 5:
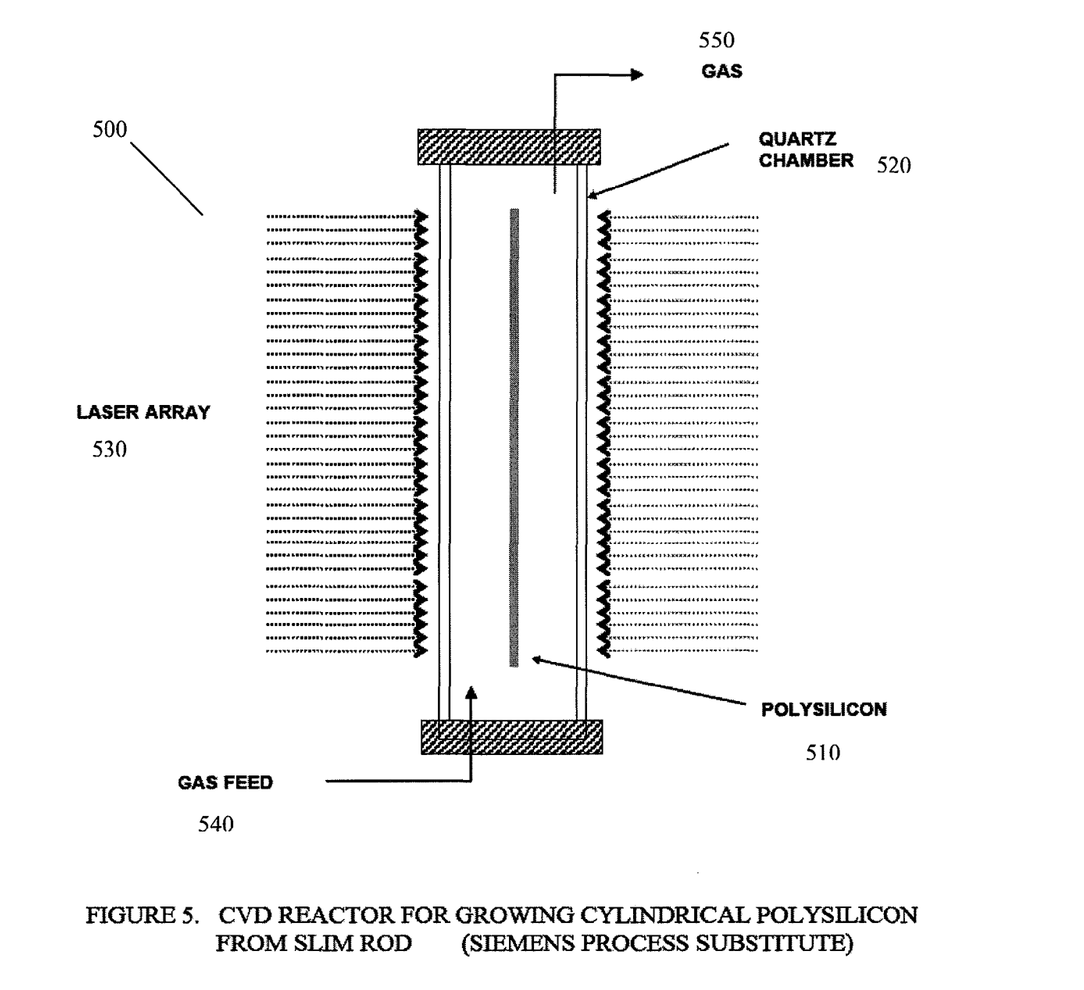
FIG. 5 illustrates a CVD reactor for growing cylindrical polysilicon from a slim rod, according to embodiments of the present disclosure.

A schematic of a single laser-only heated slim rod Siemens type CVD reactor 500 with quartz outer tube is shown in FIG. 5. The reactor 500 includes a polysilicon rod 510, a quartz chamber 520, a laser array 530, a gas feed in 540 and a gas output 550. The Siemens process uses 'Slim Rods' made of silicon as the starting substrate material. With the laser array as the only heating source, the slim rod substrate may be used with no electric heating as shown in the figure. The uniformity of deposition can be achieved for rod substrates by slowly rotating the piece continuously or alternately by having the laser beams overlap and impinge on the substrate from different directions.

The process details are same as in Example 1 except for the use of laser for initial heating and/or the deposition process.

Example 4

The laser heating scheme of this invention also offers considerable flexibility regarding substrate geometries. In the Siemens process, the temperature on the surface of the rod initially and during the growth phase is a result of the resistive heating of the silicon rod by means of current passing through it. Electrical heating of the rod imposes other requirements such as the need for a cylindrical geometry in order to have uniform current distributions and thereby uniform surface temperatures in the rod. A slim starting rod is made by pulling from a silicon melt in a special crystal growth furnace. It has a small initial surface area and hence low deposition rates for a good part of the deposition time until the diameter increases substantially.

Figure 6:
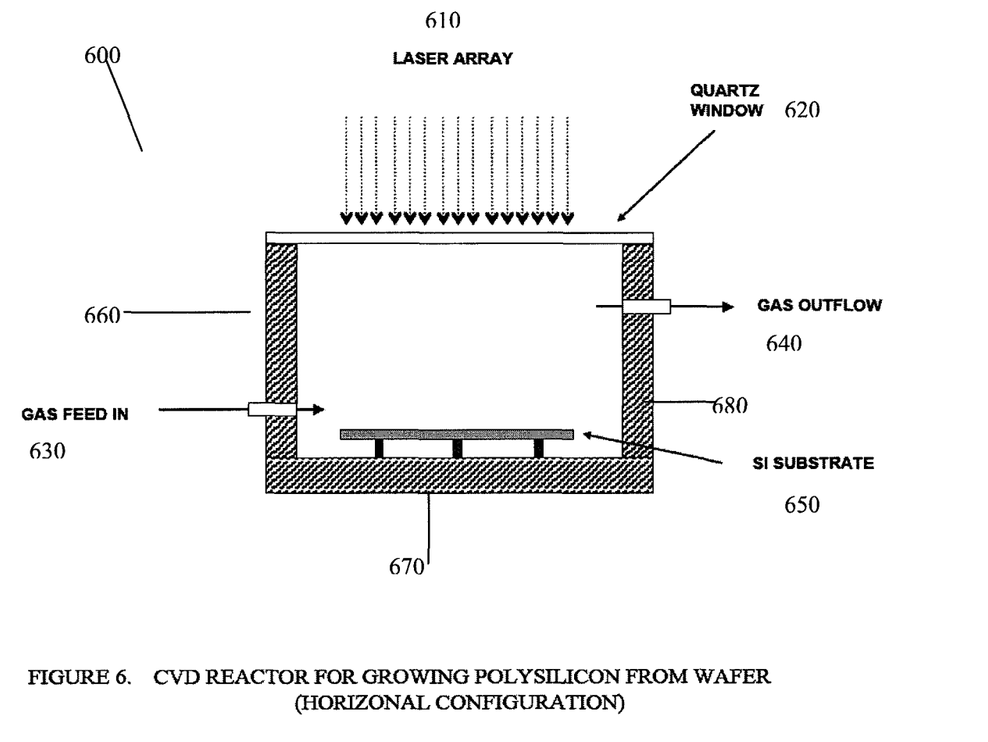
FIG. 6 depicts a CVD reactor for growing polysilicon from a wafer, in a horizontal configuration, according to embodiments of the present disclosure.

Since the laser radiation will be applied only on the (outside) surfaces of the substrate, there is more freedom to consider other geometries to increase process efficiencies and reduce cost. Instead of a slim rod, the starting substrate can be, for example, a thin slab of silicon cut from an ingot. The slab of rectangular, or in general, a non circular cross section can be made to have a large surface area that can be exposed to laser heating on all its deposition surfaces. The slab may be held in the reactor in a vertical position (or horizontal position with appropriate support to minimize conduction loss). For minimal conduction heat loss and high energy efficiency, laser radiation is preferably applied to all surfaces of the substrate for energy-efficient silicon deposition on all surfaces. In order to cover the entire surface area, multiple laser beams with overlap on the surface can be used. It is also possible to shield and insulate the silicon substrate except for the irradiated surface(s) to further reduce radiation losses. For special applications, such as thin film deposition, or for growth on one surface only, the substrate can be laser heated only on one surface. FIG. 6 shows a planar rectangular silicon substrate 650 horizontally positioned within the reactor 600 for such a deposition application. The reactor 600 includes a laser array 610, a quartz window 620, a gas feed in 630, a gas outflow 640 and reflective metal walls 660, 670, and 680. Assuming, that the planar silicon starting substrate has the same surface area as the final Siemens rod, the time required for the same quantity of polysilicon is approximately halved.

A thin strip or wafer of silicon can also be the starting substrate for the laser only CVD process. The substrate can be wafers cut from a silicon block or ribbons from an edge defined film fed growth (EFG) process. As before, a rectangular polysilicon block can be grown in the CVD reactor.

The starting silicon substrate can be obtained from silicon ingot or wafer with the right purity and amount of dopants as required.

Other silicon substrates such as plates, rounds, and other shapes for polysilicon or other material deposition are potentially practical for special applications.

Example 5

The Siemens reactor essentially produces long cylindrical polysilicon rods. Before charging the crystal growth furnaces at the next stage of manufacture, these have to be broken or crushed into small chunks. The crushing process introduces some impurities into the silicon chunks. It also results in fine particles (sub millimeter size) that are of considerably lesser value and therefore often requires reformatting.

Figure 7A:
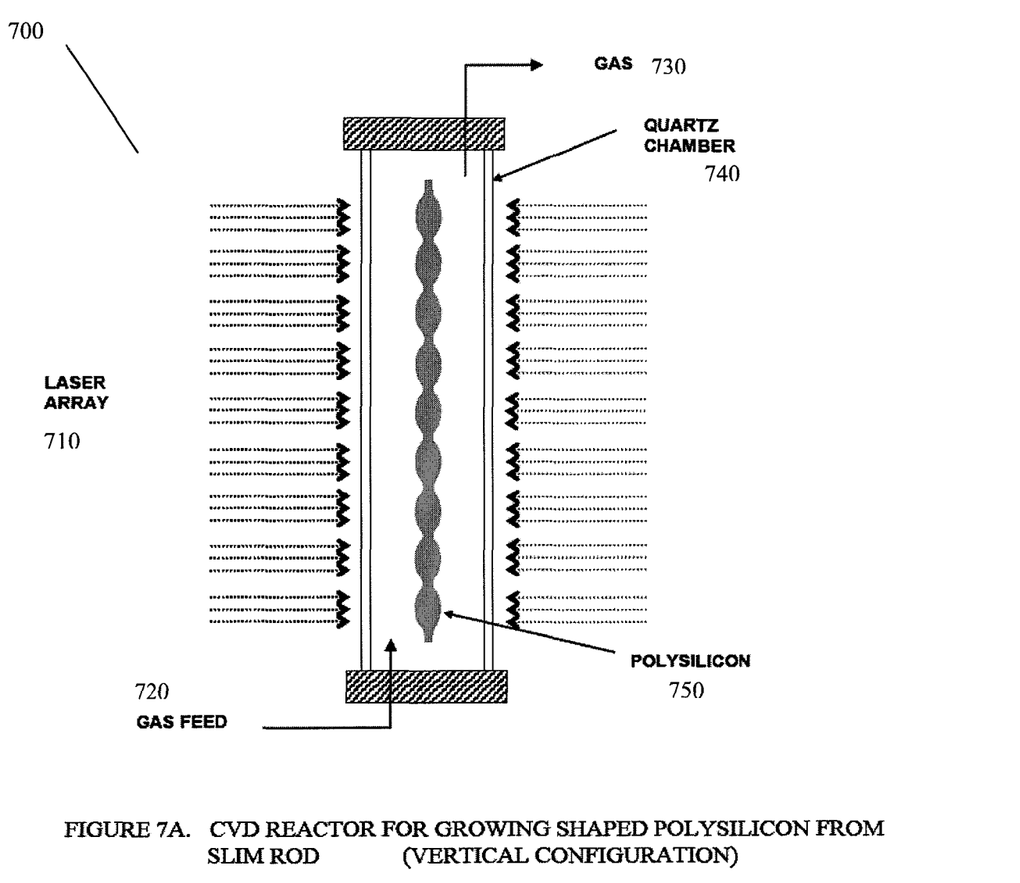
FIG. 7A depicts a CVD reactor for growing shaped polysilicon from a slim rod, in a vertical configuration, according to embodiments of the present disclosure.
Figure 7B:
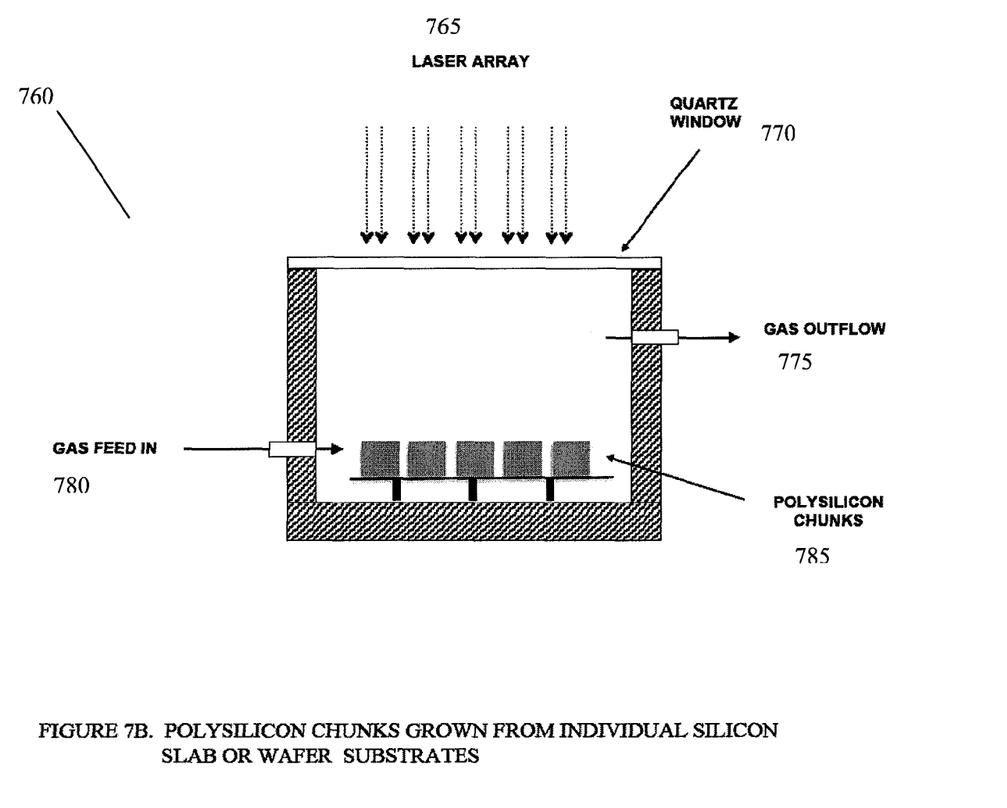
FIG. 7B depicts a CVD reactor for growing polysilicon chunks from individual silicon slabs, in a horizontal configuration, according to embodiments of the present disclosure.

The laser only heating scheme in the reactor can be manipulated to avoid these problems. The polysilicon growth shape can be shaped to obtain thin sections or grooves by not having the same temperature on the surface, i.e., having non uniform laser radiation on the substrate. The thin sections incorporated throughout the length and/or breadth of the final shaped polysilicon product would make it easy to snap or cut it into small regular chunks without the need for crushing. Care must be taken to ensure that the deposited polysilicon does not flake off as a result. FIGS. 7A and 7B shows an example of shaped silicon 750, 785 grown with the laser-only heated CVD process for cylindrical geometry.

FIG. 7A depicts a reactor 700 with a laser array 710, a gas feed 720, a gas outlet 730, a quartz chamber 740 and shaped polysilicon 750. One can do the same with planar substrate geometries too, with the grooves along one or two axes, enabling the grown bulk polysilicon piece to be broken into smaller chunks. This scheme can be extended to produce small regular chunks, that would need no crushing or breaking up and that can be fed directly into a crystal growth furnace (as shown in FIG. 7B). For example, with a CVD reactor as shown in FIG. 6, small pieces of silicon wafer, say 25 mm square, can be placed on a support table with a nominal spacing of 3 mm between the pieces. The laser beam or array is geometrically displaced so as to have uniform radiation on each silicon piece but none in the spacing between the pieces. The same effect can be obtained with a large silicon starting substrate with the laser heating as above. The CVD reaction will cause silicon deposition only on the hot silicon surfaces, resulting eventually in the formation of regular chunks that are, without any crushing, ready as the right size feedstock for crystal growth.

FIG. 7B illustrates the arrangement for growth of multiple silicon chunks within the same reactor. FIG. 7B depicts a reactor 760, a laser array 765, a quartz window 770, gas outflow 775, gas feed in 780 and polysilicon chunks 785.
Variations of Method 2

The main unwanted byproduct of the Siemens reactor with the extensively used TCS as the feed gas, is silicon tetrachloride, STC. It can be converted to silicon but requires a higher temperature, typically 1200 C, which is beyond the reach of the Siemens reactor as explained earlier. The laser can easily heat the substrate to higher temperatures. Hence, as shown in the example below, the STC from the TCS reactions can also be converted to silicon. This will bypass an energy intensive process to convert STC to TCS that is then the feed gas for silicon deposition once more.

Example 6

The exhaust gases from the laser reactor such as in descriptions above, after minimal separation—HCl and TCS, for example, are passed into another laser reactor. In this second reactor, the substrate is kept at approximately 1200 C, which is above the set temperature for the TCS reactor. The decomposition reaction is:

$$SiCl_4 + 2H_2 \rightarrow Si + 4HCl \tag{5}$$

The deposition reaction competes with reduction by hydrogen of STC to TCS and DCS. Both of these compounds will also deposit silicon. The reaction conditions for favorable silicon deposition are dependent on temperature, Cl/H ratio (i.e. hydrogen dilution of the STC) and efficient removal of the HCl by-product to prevent silicon etching.

Figure 8:
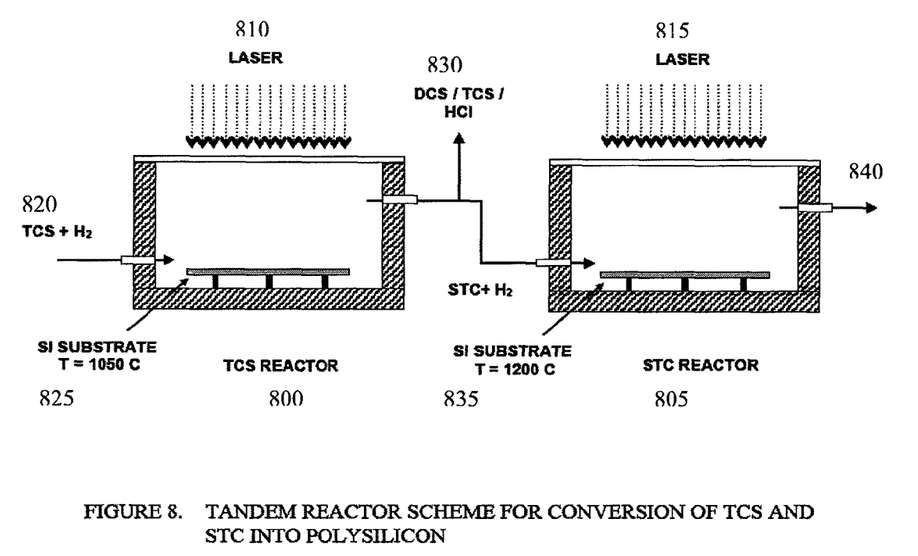
FIG. 8 depicts a tandem reactor scheme for conversion of trichlorosilane and silicon tetrachloride into polysilicon, according to embodiments of the present disclosure.

FIG. 8 shows the tandem reactor scheme for conversion of both TCS and STC into polysilicon. FIG. 8 depicts a TCS reactor 800 and an STC reactor 805, connected through a connection 830 with a DCS/TCS/HCl diverter. The TCS reactor 800 includes a silicon substrate 825, an inlet for TCS and hydrogen 820, a laser array 810 and an outlet. The silicon substrate 825 is heated to 1050 degrees Celsius to cause decomposition and reduction of the TCS and deposition of silicon on the surface of the silicon substrate 825. The STC reactor includes a laser array 815, a silicon substrate 835, and a gas outlet 840. The silicon substrate 835 is heated to 1200 degrees Celsius to cause decomposition and reduction of the STC and deposition of silicon on the surface of the silicon substrate 835.

A similar temperature optimized series laser reactor may be used for conversion of another by-product, dichlorosilane.

In another embodiment, a single laser reactor kept at ~1200 C can be used for decomposition of all chlorosilanes—di-, tri- and tetrachlorosilane into silicon after optimization of the deposition conditions.

While there have been shown, applications of lasers for bulk silicon deposition on silicon, it can also be applied for thin film depositions, depositions of other materials such as silicon oxide, silicon nitride, silicon carbide and mixed compositions of such materials on silicon and epitaxial deposition of silicon on silicon substrates.

While there have been shown and described examples of the present invention, it will be readily apparent to those skilled in the art that various changes and modifications may be made therein without departing from the scope of the invention.

What is claimed is:

1. A method of producing bulk silicon material in a chemical deposition reactor, comprising:
   providing a silicon deposition surface within the chemical deposition reactor;
   introducing hydrogen and a silicon precursor gas into the chemical deposition reactor, wherein the silicon precursor gas is silane or a gas selected from the group consisting of dichlorosilane, trichlorosilane, silicon tetrachloride, and mixtures thereof;
   non-uniformly irradiating portions of the surface of the silicon deposition surface using radiation from an array of non-uniformly distributed lasers wherein the array of non-uniformly distributed lasers provide irradiated and non-irradiated surfaces along the longest dimension of the silicon deposition surface, wherein the said irradiated and non-irradiated surfaces comprise alternating regions of the silicon deposition surface heated to temperatures at or above a deposition temperature and regions of the silicon deposition surface at temperatures below the deposition temperature, wherein the deposition temperature is the temperature in which silicon is deposited from the silicon precursor gas; and
   selectively depositing bulk silicon from the silicon precursor gas near the irradiated surfaces to form a plurality of notches along the longest dimension of the silicon deposition surface; and
   breaking the selectively deposited silicon deposition surface with the plurality of notches at the notches.

2. The method of claim 1, wherein the silicon material comprises a high purity polysilicon material.

3. The method of claim 1, wherein the silicon material comprise a bulk material.

4. The method of claim 1, wherein the array of non-uniformly distributed lasers operates between about five hundred watts and about one hundred kilowatts.

5. The method of claim 1, wherein the wavelength of the array of non-uniformly distributed lasers is selected from a group consisting of near infrared, visible, and ultraviolet wavelengths.

6. The method of claim 1, where the array of non-uniformly distributed lasers comprises a continuous wave laser.

7. The method of claim 1, wherein the silicon precursor gas comprises trichlorosilane, the deposition temperature being about or above 1000 degrees Celsius.

8. The method of claim 1, wherein the silicon precursor gas comprises silicon tetrachloride, the deposition temperature being about or above 1200 degrees Celsius.

9. The method of claim 1, wherein the silicon deposition surface comprises a one of pure silicon or doped silicon.

10. The method of claim 1, wherein the silicon deposition surface substrate comprises one on a U shaped rod or straight rod.

11. The method of claim 1, wherein the silicon deposition surface comprises one on a planar silicon substrate.

12. The method of claim 1, wherein the array of non-uniformly distributed laser comprises one of a solid state diode laser and fiber laser.

13. The method of claim 1, wherein the plurality of notches are obtained by at least one of spatial and temporal modulation of laser array.

14. The method of claim 1, wherein the silicon precursor gas comprises silane, the deposition temperature being about 800° C. to about 900° C.

* * * * *